(12) United States Patent
Choi

(10) Patent No.: US 7,629,090 B2
(45) Date of Patent: Dec. 8, 2009

(54) RETICLE AND METHOD OF MANUFACTURING METHOD THE SAME

(75) Inventor: Chul Chan Choi, Kyeongki-Do (KR)

(73) Assignee: Hynix Semiconductor Inc., Icheon-shi (KR)

( * ) Notice: Subject to any disclaimer, the term of this patent is extended or adjusted under 35 U.S.C. 154(b) by 383 days.

(21) Appl. No.: 11/646,859

(22) Filed: Dec. 28, 2006

(65) Prior Publication Data

US 2008/0081265 A1    Apr. 3, 2008

(30) Foreign Application Priority Data

Sep. 29, 2006    (KR) ........................ 10-2006-0096106

(51) Int. Cl.
*G03F 1/00* (2006.01)
*G03F 1/14* (2006.01)
(52) U.S. Cl. ............................... 430/5; 428/14
(58) Field of Classification Search ..................... 430/5; 428/14; 378/35
See application file for complete search history.

(56) References Cited

U.S. PATENT DOCUMENTS

| | | | |
|---|---|---|---|
| 6,780,548 B1 * | 8/2004 | Kalk | 430/5 |
| 2003/0024274 A1 * | 2/2003 | Cho et al. | 65/386 |
| 2006/0083997 A1 * | 4/2006 | Lin et al. | 430/5 |

FOREIGN PATENT DOCUMENTS

| | | |
|---|---|---|
| KR | 10-1996-0042202 A | 12/1996 |
| KR | 1998-0003826 | 3/1998 |
| KR | 2001-0004926 | 1/2001 |
| KR | 2006-0078472 | 7/2006 |

* cited by examiner

*Primary Examiner*—Stephen Rosasco
(74) *Attorney, Agent, or Firm*—Marshall, Gerstein & Borun LLP

(57) ABSTRACT

A reticle and a method of producing the same are disclosed. The reticle includes a medium layer formed on a transparent substrate, chrome layer patterns spaced apart from each other at predetermined intervals on the medium layer, and a frame and a pellicle formed to enclose the resulting structure. The method of manufacturing a reticle includes the steps of forming a medium layer on a transparent substrate, forming chrome layers on the medium layer, patterning the chrome layers so that the chrome layers are spaced apart from each other at predetermined intervals, and attaching a frame and a pellicle to surround the result. The resolution and focus of light output from the reticle is improved.

18 Claims, 3 Drawing Sheets

PRIOR ART

US 7,629,090 B2

RETICLE AND METHOD OF MANUFACTURING METHOD THE SAME

BACKGROUND OF THE INVENTION

The present invention relates to a reticle and, more particularly, to a reticle and a method of manufacturing the same. Micro patterns in the reticle can be formed by improving the resolutions of exposure equipment by employing a difference in the refractive index between media.

In the manufacture of semiconductor devices, photolithograph technology is used to form patterns on a semiconductor substrate. In this photolithographic process, a photomask pattern is transferred as a photosensitive resin phase deposited on the semiconductor substrate by means of a reduction projection exposure apparatus, so that a desired pattern of the photosensitive resin is developed and obtained.

The photomask is a negative plate for projection exposure. The photomask is formed by depositing a light-shielding layer on a transparent substrate, and then by partially removing the light-shielding layer to form a transmission region and a light-shielding region. That is, the reduction ratio of the projection exposure apparatus (the size of a pattern on the photomask versus the size of a formed image) is not 1:1. The negative plate of reduction projection exposure is particularly referred to as a "reticle".

FIG. 1 is a cross-sectional view of a conventional reticle.

Referring to FIG. 1, the conventional reticle 100 includes chrome (Cr) layer patterns 120 patterned at regular intervals below a quartz substrate 110, a frame 130, a pellicle 140 for preventing the attachment of alien substance in a photolithograph process, and an air layer 150 between the quartz substrate 110 and the pellicle 140.

The Cr layer patterns 120 are made of Cr capable of completely shielding light. A portion in which the Cr layer patterns 120 are formed becomes a light-shielding region A. A portion including only the quartz substrate 110 between the Cr layer patterns 120 becomes a transmission region B through which light can pass. The air layer 150 is formed between the transmission region B and the pellicle 140, and causes air to serve as a medium.

FIG. 2 is a view illustrating the traveling path of light passing through the conventional reticle and a numerical aperture (NA).

The path of light passing through a reticle 200 having a half-pitch (p) is described below with reference to FIG. 2.

Light 260 incident on a quartz substrate 210 at an incident angle $\theta_i$ is refracted from a boundary surface between a quartz substrate 210 having a refractive index of 1.5 and an air layer 250 having a refractive index of 1 within the transmission region B at an angle of $\theta_r$. At this time, the light 260 moves from the quartz substrate 210 having a high refractive index to the air layer 250 having a low refractive index. Thus, the refracted angle $\theta_r$ becomes greater than the incident angle $\theta_i$ according to Snell's law.

Thereafter, the refracted light 260 passes through a pellicle 240 and is then focused on a lens 270. The lens 270 is disposed under the reticle 200 and has an NA of a specified amount.

In recent years, semiconductor products have become miniaturized and highly integrated. Thus, processes and methods for increasing the resolution limit (hereinafter, referred to as the "resolution") in an exposure process are required. Of them, there has been proposed a method of reducing the half-pitch of the reticle by decreasing the size of the Cr layer patterns in the reticle itself.

FIG. 3 is a view illustrating the path of light passing through another conventional reticle and the NA.

The path of light passing through a reticle 300 having a small half-pitch p1 as Cr layer patterns 320 become small is described below with reference to FIG. 3.

Light 360 incident on a quartz substrate 310 at an incident angle (not shown) is refracted from a boundary surface between a quartz substrate 310 having a refractive index of 1.5 and an air layer 350 having a refractive index of 1 within the transmission region B at an angle of $\theta_m$.

At this time, the light 360 moves from the quartz substrate 310 having a high refractive index to the air layer 350 having a low refractive index. Thus, the refracted angle $\theta_m$ becomes greater than the incident angle according to Snell's law.

Thereafter, the refracted light 360 passes through a pellicle 340 and is then focused on a lens 370 disposed under the reticle 300 and having an NA of a specified amount. However, some of the refracted light 360 is not focused on the lens 370 and it is therefore radiated to the outside. Reference numerals 230 and 330 indicate frames, and A indicates the light-shielding region in which light is shielded.

If the chrome layer patterns 320 of the reticle 300 become small and the half-pitch p1 becomes small in order to form a micro pattern as in the prior art, a difference in the path of the light 360 passing between the Cr layer patterns 320 in the structure of the reticle 300 in which the air layer 350 is used as a medium results in greater refraction according to the following Equation 1.

$$\sin\theta = \frac{\lambda}{p}, \quad (1)$$

where $\theta$ is the refracted angle, $\lambda$ is the wavelength of a light source, and p is the half-pitch of the reticle.

Therefore, in the case where the same NA is used, if the half-pitch of the reticle becomes small as shown in FIG. 3, the refracted angle increases. Accordingly, because the +1 order light required for patterning is not focused on the lens, there is a problem in that micro patterns are not implemented on a wafer.

Due to this, it is necessary to develop and purchase new and expensive exposure equipment to form micro patterns exceeding the resolution of existing exposure equipment.

BRIEF SUMMARY OF THE INVENTION

The present invention provides a reticle and a method of manufacturing the same, in which micro patterns can be formed by improving the resolutions of exposure equipment although the half-pitch is reduced when using the existing NA, by employing a difference in the refractive index between media in an exposure process for a semiconductor device.

In an embodiment, a reticle includes a medium layer formed on a transparent substrate, chrome layer patterns spaced apart from each other at predetermined intervals on the medium layer, and a frame and a pellicle formed to enclose the resulting structure formed by the medium layer, the transparent structure, and the chrome layer patterns.

In another embodiment, a method of manufacturing a reticle includes the steps of forming a medium layer on a transparent substrate, forming a chrome layer on the medium layer, patterning the chrome layer, thereby forming chrome layer patterns that are spaced apart from each other at predetermined intervals, and attaching a frame and a pellicle to enclose the resulting structure.

DESCRIPTION OF SPECIFIC EMBODIMENTS

Specific embodiments according to the present disclosure are described with reference to the accompanying drawings.

Figure 1:
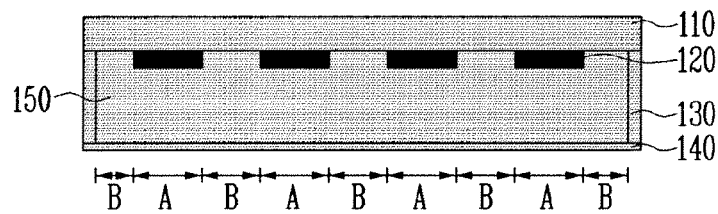
FIG. 1 is a cross-sectional view of a conventional reticle.
Figure 2:
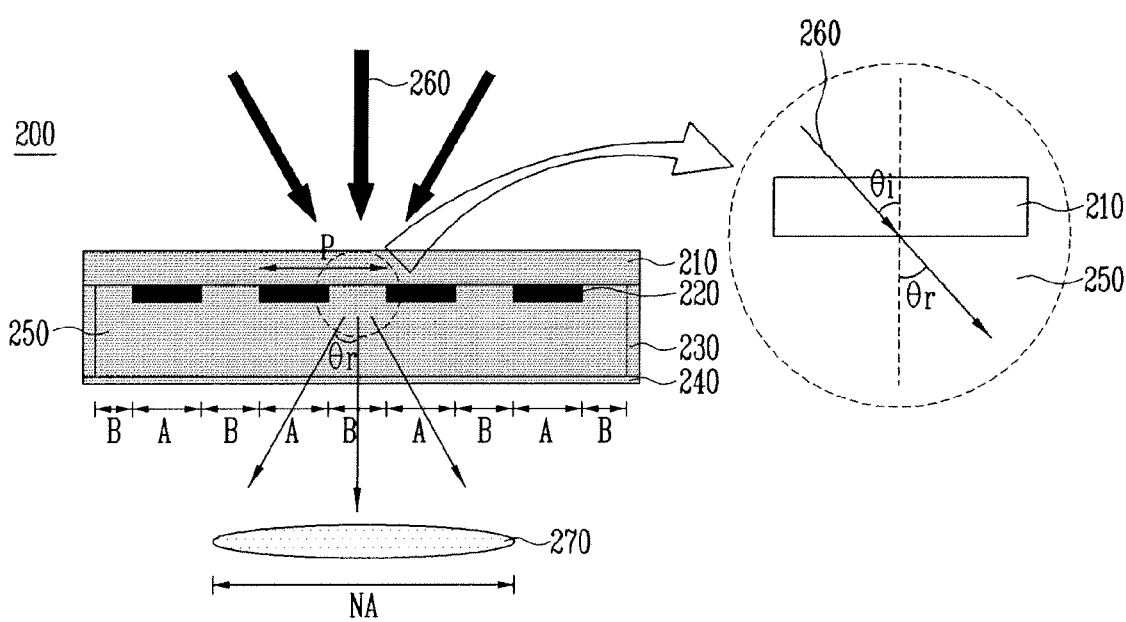
FIG. 2 is a view illustrating the path of light passing through the conventional reticle of FIG. 1 and a numerical aperture.
Figure 3:
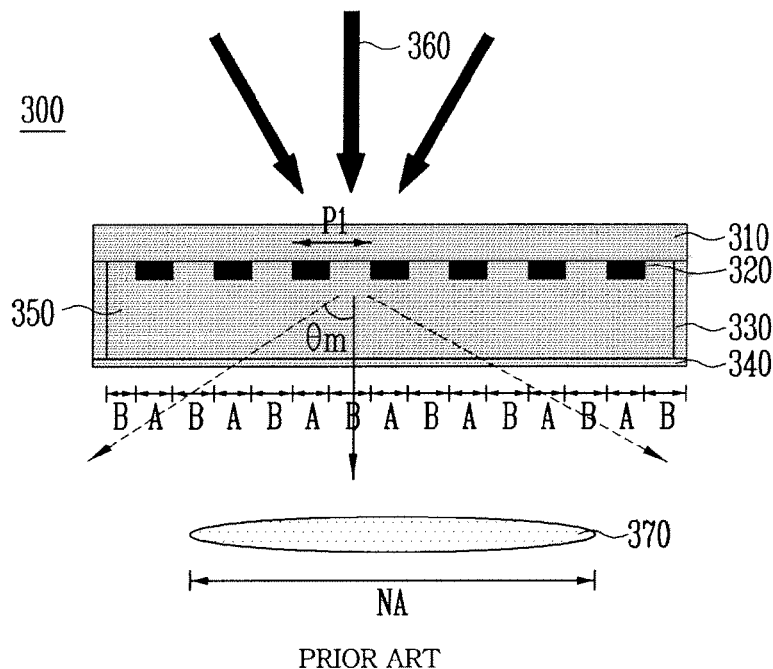
FIG. 3 is a view illustrating the path of light passing through another conventional reticle and a numerical aperture.
Figure 4A:
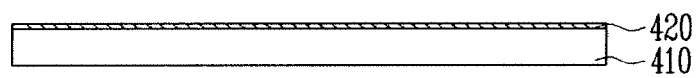
FIGS. 4A to 4F are cross-sectional views illustrating a method of manufacturing a reticle according to an embodiment of the present invention.

Referring to FIG. 4A, a medium layer 420 is formed on a transparent substrate 410. The transparent substrate 410 can be formed using quartz having a high transmittance and having a lower deviation resulting from bending or thermal expansion incurred by the weight of dimension change itself. The quartz has a refractive index of 1.5.

The medium layer 420 is formed using material capable of transmitting light. The medium layer 420 can be formed using a material having a refractive index higher than that of the transparent substrate 410 in order to employ Snell's Law due to the difference in the refractive index between media. The medium layer 420 is preferably formed using a material having a refractive index of 1.5 or more.

Preferably, the medium layer 420 can be formed using either a glass-based material of a transparent component or a polymer-based material in order to minimize the change in the light wavelength.

The glass-based material is preferably formed using one selected from the group consisting of sodalime glass, borosilicate glass, alkali-free glass, and so on.

The polymer-based material is preferably formed using one selected from a group consisting of polycarbonate, polyacrylate, polyethersulphone, and so on.

The height of the medium layer 420 can be decided according to the refracted angle of light by taking into consideration the refractive index of the medium.

The medium layer 420 can be formed by a spin coating method.

Alternatively, a cleaning process can be further performed to enhance the interfacial adhesive force between the transparent substrate 410 and the medium layer 420 before the medium layer 420 is formed on the transparent substrate 410.

Figure 4B:
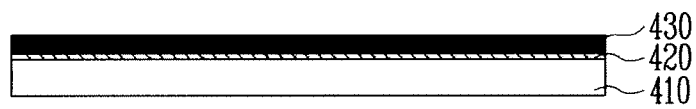

Referring to FIG. 4B, a chrome layer 430 is formed on the medium layer 420. The chrome layer 430 is made of chrome (Cr) capable of completely shielding light, and can be formed by physical vapor deposition (PVD), for example by a sputtering method.

Figure 4C:
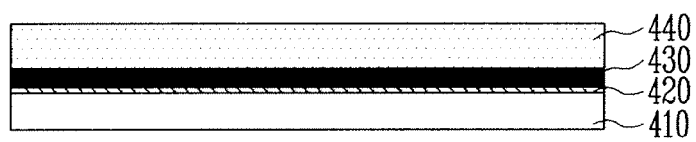

Referring to FIG. 4C, a photoresist PR, which is sensitive to the illumination of light, is coated on the chrome layer 430 to form a photoresist film 440. The photoresist film 440 can be formed by a spin coating method.

Figure 4D:
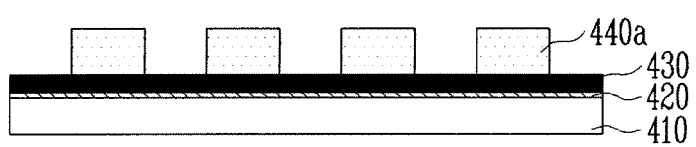

Referring to FIG. 4D, photoresist film patterns 440a are formed on the photoresist film 440 by means of exposure and development processes employing a previously designed mask (not shown). The light used for patterning has a wavelength of 248 nm or less.

Figure 4E:
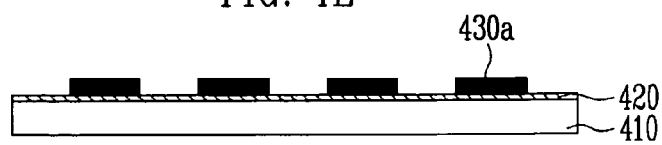

Referring to FIG. 4E, the chrome layer 430 is patterned using the photoresist film patterns 440a as masks, thus forming chrome layer patterns 430a spaced apart from each other at specific intervals on the medium layer 420. The photoresist film patterns 440a are subsequently removed.

Figure 4F:
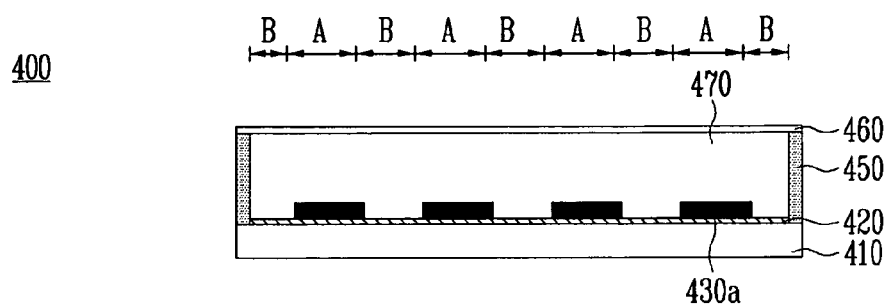

Referring to FIG. 4F, a frame 450 and a pellicle 460 are attached so that they enclose the resulting structure, thereby forming a reticle 400. The pellicle 460 serves to prevent foreign substances from being adhered during a photolithograph process. Empty space between the medium layer 420, the frame 450 and the pellicle 460 is filled with air to form an air layer 470 so that air serves as a medium. The reticle 400 is thereby completed.

In the reticle 400, portions in which the chrome layer patterns 430a are formed become a light-shielding region A. Portions including the transparent substrate 410 and the medium layer 420 between the chrome layer patterns 430a become a transmission region B through which light can pass.

As described above, according to the present invention, the medium layer 420 having a refractive index of 1.5 or more is formed between the transparent substrate 410 and the chrome layer patterns 430a, thus forming the reticle 400. Accordingly, Snell's Law is applied in the reticle 400 between the incident angle and refracted angle of light that passes through the boundary surface of two media having different refractive indices: the transparent substrate 410 having a refractive index $n_1$ of 1.5 and the medium layer 420 having a refractive index $n_2$ of 1.5 or more.

Furthermore, Snell's Law is applied in the reticle 400 between the incident angle and refracted angle of light that passes through the boundary surface of two media having different refractive indices: the medium layer 420 having a refractive index $n_2$ of 1.5 or more and the air layer 470 having a refractive index $n_3$ of 1. This is expressed in the following equation 2.

Equation 2

$$n_1 \sin \theta_1 = n_2 \sin \theta_2 \text{ and}$$

$$n_2 \sin \theta_2 = n_3 \sin \theta_3, \quad (2)$$

where $n_1$ the refractive index of the transparent substrate 410, $n_2$ is the refractive index of the medium layer 420, $n_3$ is the refractive index of the air layer 470, $\theta_1$ is the incident angle of light within the transparent substrate 410, $\theta_2$ is the refracted angle of light of the transparent substrate 410 or the incident angle of light within the medium layer 420, and $\theta_3$ is the refracted angle of light of the medium layer 420.

Therefore, light incident on the transparent substrate 410 at an incident angle $\theta_1$ is refracted from the boundary surface of the transparent substrate 410 and the medium layer 420 having different refractive indices. Because the light moves from the transparent substrate 410 having a lower refractive index to the medium layer 420 having a higher refractive index, the refracted angle $\theta_2$ becomes smaller than the incident angle $\theta_1$ in accordance with Snell's Law.

The refracted angle $\theta_2$ of light of the transparent substrate 410 is identical to the incident angle $\theta_2$ of light within the medium layer 420. Thus, the light incident on the medium layer 420 at the incident angle $\theta_2$ is refracted from the boundary surface of the medium layer 420 and the air layer 470 having different refractive indices. At this time, since the light moves from the medium layer 420 having a high refractive index to the air layer 470 having a low refractive index, the refracted angle $\theta_3$ becomes larger than the incident angle $\theta_2$ in accordance with Snell's Law.

In the present invention, however, the medium layer 420 having a high refractive index is formed between the transparent substrate 410 and the air layer 470. The medium layer 420 causes the refracted angle of the light incident on the transparent substrate 410 to be lowered. Accordingly, the refracted angle $\theta_3$ of light passing through the chrome layer patterns 420 can be reduced relative to the prior art to the greatest extent possible. Further, valid +1 order light, which is emitted from the reticle and is necessary for patterning, can be focused on the lens to the maximum extent possible.

The reticle constructed above is used to form an actual pattern in an exposure process in the manufacture process of a semiconductor device, and can be applied to both binary and phase shift masks.

Figure 5:
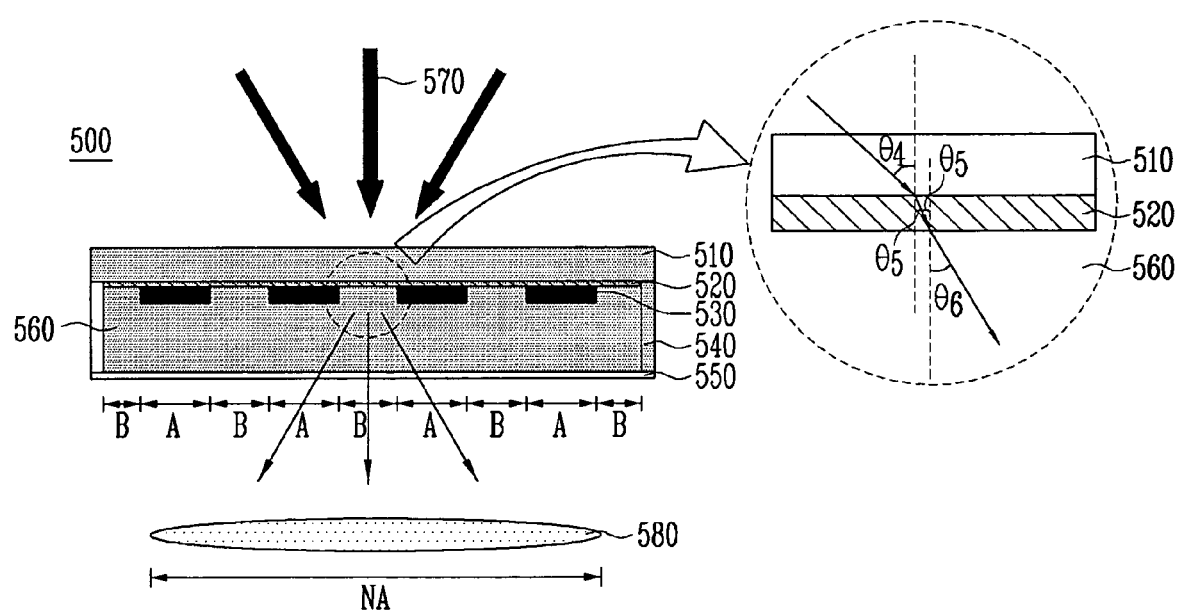
FIG. 5 is a view illustrating the path of light passing through a reticle and a numerical aperture according to an embodiment of the present invention.

FIG. 5 is a view illustrating the traveling path of light passing through a reticle and an NA according to an embodiment of the present invention.

The path of light passing through a reticle 500 according to another embodiment of the present invention is described below with reference to FIG. 5.

Light 570 incident on a transparent substrate 510 at an incident angle $\theta_4$ is refracted from the boundary surface of a transparent substrate 510 and a medium layer 520 having different refractive indices at an angle $\theta_5$. Because the light 570 moves from the transparent substrate 510 having a lower refractive index to the medium layer 520 having a higher refractive index, the refracted angle $\theta_5$ becomes smaller than the incident angle $\theta_4$ in accordance with Snell's Law.

Thereafter, the light 570 incident on the medium layer 520 at the same incident angle $\theta_5$ as the refracted angle $\theta_5$ of the transparent substrate 510 is refracted from the boundary surface of the medium layer 520 and an air layer 560 having different refractive indices at an angle $\theta_6$. Because the light 570 moves from the medium layer 520 having a higher refractive index to the air layer 560 having a lower refractive index, the refracted angle $\theta_6$ becomes larger than the incident angle $\theta_5$ in accordance with Snell's Law.

Thereafter, the light 570 passing through the air layer 560 at the refracted angle $\theta_6$ passes through a pellicle 550 and is then focused on a lens 580 having a specific NA.

However, as described above, the refracted angle $\theta_5$ of the light 570 incident on the transparent substrate 510 is decreased through the medium layer 520, and the refracted angle $\theta_6$ of the light that has passed through the air layer 560 within a transmission region B and passed between chrome layer patterns 530 is reduced to the maximum extent possible. Accordingly, the light 570 of valid +1 order light, which is output from the reticle 500 and is required for patterning, can be focused on the lens 580 to the greatest extent possible. In FIG. 5, reference numeral 540 denotes a frame, and A denotes a light-shielding region.

As described above, in the reticle 500 according to an embodiment of the present invention, the light 570 of valid +1 order light, which is necessary for patterning, can be focused on the lens 580 to the greatest extent possible. Accordingly, although the half pitch of the reticle is reduced when using a lens having the existing NA, the resolutions of exposure equipment can be further improved, and further micro patterns can be formed.

As described above, according to the present invention, the reticle is fabricated by forming the medium layer having a refractive index higher than that of the transparent substrate between the transparent substrate and the chrome layer patterns. The refracted angle of light passing through the transparent substrate can be reduced through the medium layer to the greatest extent possible. This reduces the refracted angle of light that has passed through the chrome layer patterns. Accordingly, light of valid +1 order light, which is output from the reticle and is necessary for patterning, can be focused on the lens to the greatest possible.

Furthermore, the refracted angle of light that has passed between the chrome layer patterns is lowered through the medium layer. Accordingly, although the half pitch of the reticle is decreased when using a lens having the existing NA, the resolutions of exposure equipment can be further improved and further micro patterns can be formed.

Furthermore, according to the present invention, micro patterns can be formed using the existing exposure equipment. It is therefore possible to save investment costs for new equipment.

The above embodiments of the present invention are illustrative and not limiting. Various alternatives and equivalents are possible. Other additions, subtractions, or modifications that are obvious in view of the present disclosure and are intended to fall within the scope of the appended claims.

What is claimed is:

1. A reticle, comprising:
   a medium layer formed on a transparent substrate;
   chrome layer patterns spaced apart from each other at predetermined intervals on the medium layer; and
   a frame and a pellicle formed to enclose the structure formed by the medium layer, the transparent structure, and the chrome layer patterns.

2. The reticle of claim 1, wherein the medium layer comprises a material capable of transmitting light.

3. The reticle of claim 1, wherein the medium layer has a refractive index higher than the refractive index of the transparent substrate.

4. The reticle of claim 3, wherein the medium layer comprises one of a glass-based material and a polymer-based material.

5. The reticle of claim 4, wherein the medium layer comprises the glass-based material, the glass-based material being selected from the group consisting of sodalime glass, borosilicate glass, and alkali-free glass.

6. The reticle of claim 4, wherein the medium layer comprises the polymer-based material, the polymer-based material being selected from the group consisting of polycarbonate, polyacrylate, and polyethersulphone.

7. The reticle of claim 1, wherein the medium layer has a refractive index higher than the refractive index of air.

8. A method of manufacturing a reticle, comprising:
   forming a medium layer on a transparent substrate;
   forming a chrome layer on the medium layer;
   patterning the chrome layer, thereby forming chrome layer patterns that are spaced apart from each other at predetermined intervals; and
   attaching a frame and a pellicle to enclose the resulting structure.

9. The method of claim 8, wherein the medium layer comprises a material capable of transmitting light.

10. The method of claim 8, wherein the medium layer has a refractive index higher than the refractive index of the transparent substrate.

11. The method of claim 9, wherein the medium layer comprises one of a glass-based material and a polymer-based material.

12. The method of claim 11, wherein the medium layer comprises the glass-based material, the glass-based material being selected from the group consisting of sodalime glass, borosilicate glass, and alkali-free glass.

13. The method of claim 11, wherein the medium layer comprises the polymer-based material, the polymer-based material being selected from the group consisting of polycarbonate, polyacrylate, and polyethersulphone.

14. The method of claim 8, wherein the medium layer has a refractive index higher than the refractive index of air.

15. The method of claim 8, further comprising the step of performing a cleaning process prior to the step of forming the medium layer.

16. The method of claim 10, wherein the medium layer comprises one of a glass-based material and a polymer-based material.

17. The method of claim 16, wherein the medium layer comprises the glass-based material, the glass-based material being selected from the group consisting of soda lime glass, borosilicate glass, and alkali-free glass.

18. The method of claim 16, wherein the medium layer comprises the polymer-based material, the polymer-based material being selected from the group consisting of polycarbonate, polyacrylate, and polyethersulphone.

* * * * *